US007870415B2

(12) United States Patent
Kummaraguntla et al.

(10) Patent No.: US 7,870,415 B2
(45) Date of Patent: Jan. 11, 2011

(54) CLOCK PROCESSORS IN HIGH-SPEED SIGNAL CONVERTER SYSTEMS WITH DATA CLOCK ALIGNER SHARING ERROR SIGNAL PRODUCED IN DUTY CYCLE STABILIZER

(75) Inventors: Ravi Kishore Kummaraguntla, High Point, NC (US); Michael Elliott, Summerfield, NC (US)

(73) Assignee: Analog Devices, Inc., Norwood, MA (US)

( * ) Notice: Subject to any disclaimer, the term of this patent is extended or adjusted under 35 U.S.C. 154(b) by 745 days.

(21) Appl. No.: 11/895,589

(22) Filed: Aug. 24, 2007

(65) Prior Publication Data
US 2009/0055678 A1    Feb. 26, 2009

(51) Int. Cl.
*G06F 1/04* (2006.01)
(52) U.S. Cl. .................. 713/503; 341/118; 341/126
(58) Field of Classification Search .......... 713/503; 341/118, 126
See application file for complete search history.

(56) References Cited

U.S. PATENT DOCUMENTS

| 5,148,113 | A | | 9/1992 | Wight et al. | 328/155 |
|---|---|---|---|---|---|
| 5,608,357 | A | * | 3/1997 | Ta et al. | 331/57 |
| 5,872,810 | A | | 2/1999 | Philips et al. | 375/222 |
| 6,804,633 | B2 | | 10/2004 | Nygaard, Jr. | 702/189 |
| 7,012,956 | B1 | | 3/2006 | Thomsen et al. | 375/224 |
| 7,099,382 | B2 | | 8/2006 | Aronson et al. | 375/219 |
| 7,130,367 | B1 | | 10/2006 | Fu et al. | 375/376 |
| 7,184,509 | B2 | * | 2/2007 | Cho et al. | 375/373 |

OTHER PUBLICATIONS

Farjad-Rad, Ramin, "A 0.3um CMOS 8-Gb/s 4-PAM Serial Link Transceiver", IEEE Journal of Solid-State Physics, vol. 35, No. 5, May 2000, pp. 757-764s.
Bartolome, Eduardo, "Clocking high-speed data converters", Analog and Mixed Signal Products— Analog Applications Journal, Jan. 2005, pp. 20-26.
King, Ian, "Capturing Data from Gigasample Analog-to-Digital Converters" Xcell Journal, Jan. 2006, pp. 5-9s.
Sidiropoulos, Stefanos, "A Semidigital Dual Delay-Locked Loop", IEEE Journal of Solid-State Physics, vol. 32, No. 11, Nov. 1997, pp. 1683-1692.
"Digital Waveform Timing", National Instruments Tutorial, Feb. 2006, pp. 1-5.

* cited by examiner

*Primary Examiner*—Albert Wang
(74) *Attorney, Agent, or Firm*—Koppel, Patrick, Heybl & Dawson

(57) ABSTRACT

Clock processors are provided to economically control system and data clocks in high-speed signal converters. The processors generally include at least one of a delay-locked loop, phase-locked loop or a duty cycle stabilizer which generates an error signal in its operation. In the example of a stabilizer, it is configured to respond to an input clock to initiate a first portion of each cycle of the system clock and to include a control loop to provide an error signal that controls a second portion of the cycle to thereby maintain a selected duty cycle. The processors also include a data clock aligner configured to share the error signal and provide a data clock that is delayed by a selected delay from a selected one of the input and system clocks. In addition to providing effective control that is independent of disturbing effects (e.g., temperature and clock rate), the shared use reduces processor costs.

20 Claims, 5 Drawing Sheets

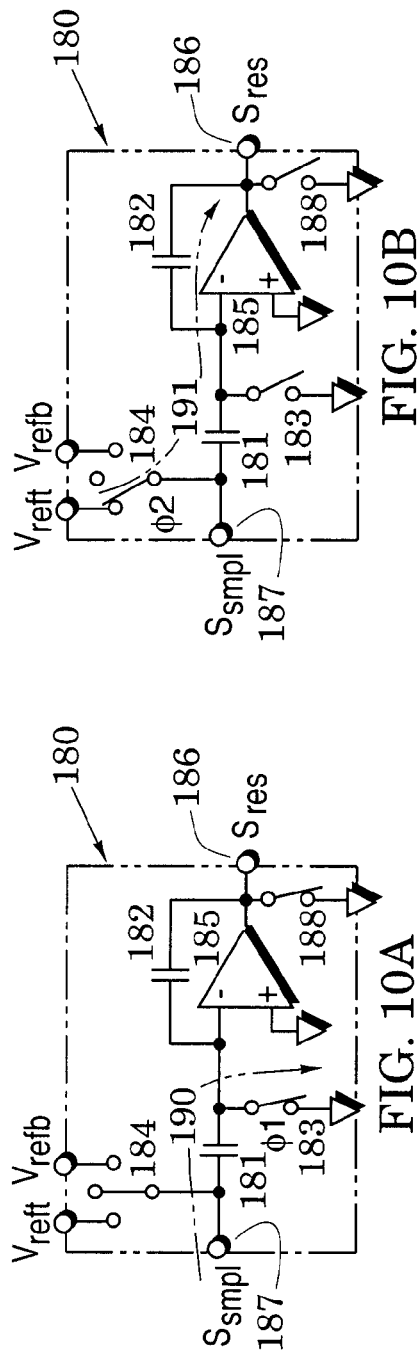
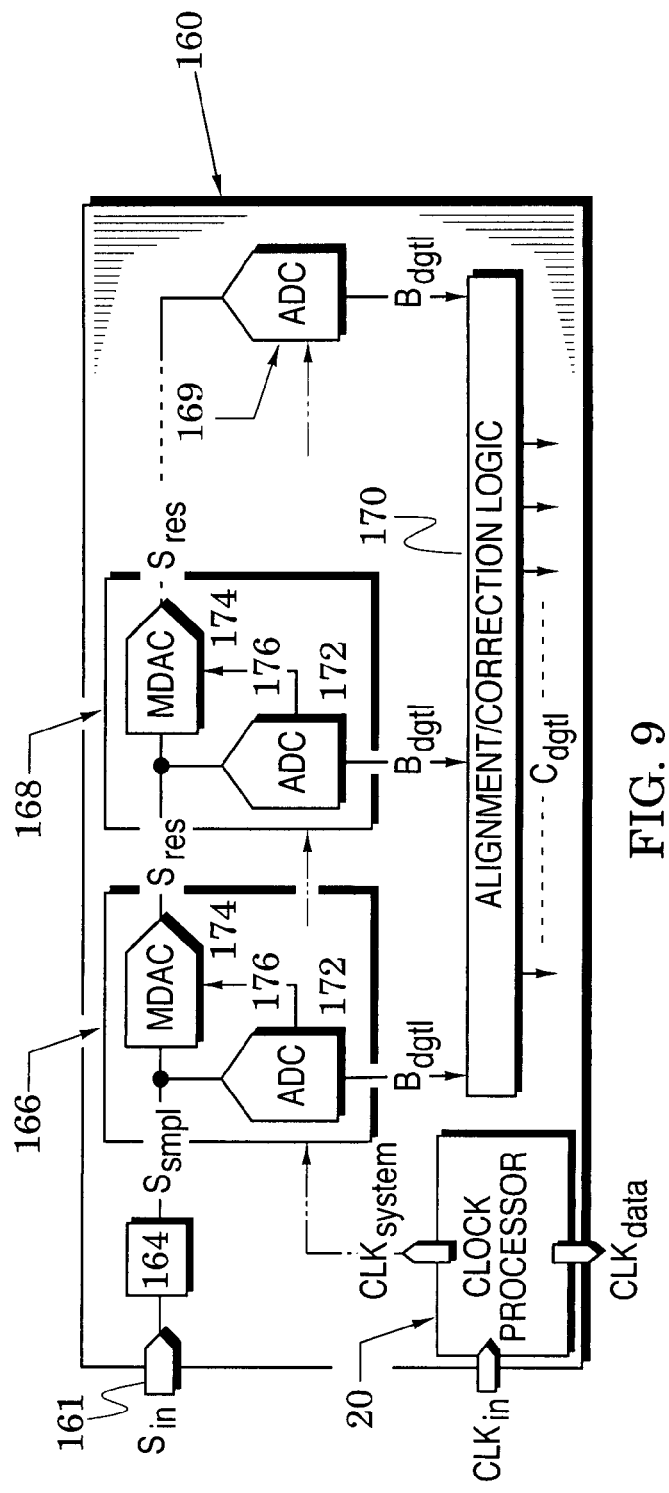

CLOCK PROCESSORS IN HIGH-SPEED SIGNAL CONVERTER SYSTEMS WITH DATA CLOCK ALIGNER SHARING ERROR SIGNAL PRODUCED IN DUTY CYCLE STABILIZER

BACKGROUND OF THE INVENTION

1. Field of the invention

The present invention relates generally to clock control in signal converter systems.

2. Description of the Related Art

The accuracy of signal conversion in some types of high-speed signal converters (e.g., pipelined converters) may be a function of the accuracy of the duty cycle of a system clock. In addition, it may be desirable to provide a data clock which can be used to facilitate recovery of data from the converters' high-speed output digital code. Such converters would benefit from clock processors that could meet these needs with economical structures whose control is substantially independent of disturbing effects such as temperature and clock rate.

BRIEF SUMMARY OF THE INVENTION

The present invention is directed to the control of system and data clocks in high-speed signal converters. The novel features of the invention are set forth with particularity in the appended claims. The invention will be best understood from the following description when read in conjunction with the accompanying drawings.

BRIEF DESCRIPTION OF THE DRAWINGS

FIG. 9 is a block diagram of a signal converter system that illustrates an application of the clock processor of FIG. 1; and FIGS. 10A and 10B illustrate operational modes in a multiplying digital-to-analog converter of the system of FIG. 9 that are controlled with a system clock from the clock processor.

DETAILED DESCRIPTION OF THE INVENTION

The drawings illustrate clock processors in which a duty cycle stabilizer is configured to respond to an input clock to initiate a first system portion of each system cycle of a system clock and to include a control loop to provide an error signal that controls a second system portion of the system cycle to thereby maintain a desired duty cycle of the system clock. The processor also includes a data clock aligner that is configured to share the same error signal to thereby provide a data clock that is delayed by a desired delay from a selected one of the input and system clocks.

In processor embodiments, the stabilizer has a stabilizer sensitivity to the control signal and the aligner has an aligner sensitivity to the control signal that generally differs from the stabilizer sensitivity and is selected to provide the desired delay. Because the control loop constantly controls the desired duty cycle of the system clock, the aligner's response to the error signal is similarly controlled. This shared use of the control signal maintains the desired duty cycle and delay independent of disturbing effects such as temperature and clock rate.

In other processor embodiments, the aligner can be configured to use the error signal of a delay-locked loop or a phase-locked loop that is included in a system for an unrelated generation of other system clocks (i.e., for a function unrelated to that of the aligner).

Figure 1:
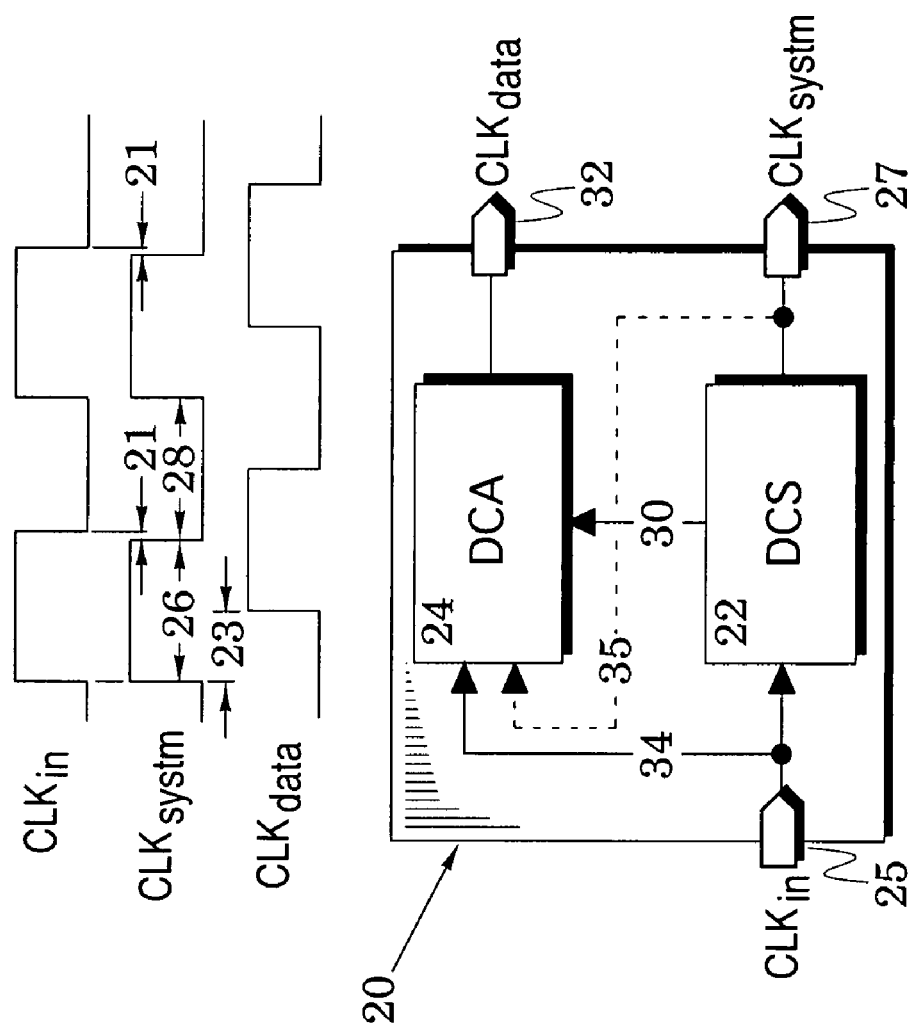
FIG. 1 is a block diagram of a clock processor embodiment.

Directing attention now to FIG. 1, a clock processor embodiment 20 is shown that includes a duty cycle stabilizer (DCS) 22 and a data clock aligner (DCA) 24 which are configured to provide a data clock $CLK_{data}$ and a system clock $CLK_{system}$ in response to an input clock $CLK_{in}$. The clock processor insures that the system clock $CLK_{system}$ has a selected duty cycle (e.g., 50 percent) even though the input clock may fail to have the selected duty cycle. For example, arrows 21 in FIG. 1 show that a second system portion 28 of each system cycle of the system clock $CLK_{system}$ has been altered relative to a corresponding portion of the input clock wherein this alteration insures that the system clock $CLK_{system}$ will have a 50 percent duty cycle.

In particular, the stabilizer 22 is configured to respond to the input clock $CLK_{in}$ at an input port 25 to thereby initiate a first system portion 26 of each system cycle of the system clock $CLK_{system}$ at a system port 27 and to include a control loop that provides an error signal which controls a second system portion 28 of the system cycle to thereby maintain the selected duty cycle of the system clock $CLK_{system}$.

The aligner 24 is configured to share the error signal 30 of the stabilizer and respond to it to thereby provide the data clock $CLK_{data}$ at a data port 32 so that it is delayed by a selected delay from a selected one of the data and system clocks. For example, arrows 23 in FIG. 1 show that the data clock $CLK_{data}$ is delayed by 90 degrees from the system clock $CLK_{system}$. As indicated by a signal path 34, the aligner 24 is configured in one processor embodiment to respond to the input clock $CLK_{in}$ at the input port 25. As indicated by a different signal path 35 (shown in broken lines), the aligner 24 is configured in another processor embodiment to respond to the system clock $CLK_{system}$ at the system port 27. This latter embodiment may be particularly useful when the duty cycle of the input clock $CLK_{in}$ significantly differs from the desired duty cycle.

The clock processor 20 is well suited for use in signal converters (e.g., pipelined converters, two-step converters and sigma-delta converters) whose conversion accuracy is enhanced by the accuracy of the duty cycle of the system clock $CLK_{system}$. It is also well suited for use in signal converters that convert an analog input signal to an output digital code at high speeds. In such converters, it is helpful to provide a data clock (sometimes referred to as a data clock output (DCO)) which has a stable and known phase relationship to the output digital code. For example, the data clock can be positioned to identify phase times at which the data in the output digital code can be reliably captured. The data clock thus provides a temporal reference which aids in recovering the data in the output digital code.

Figure 2:
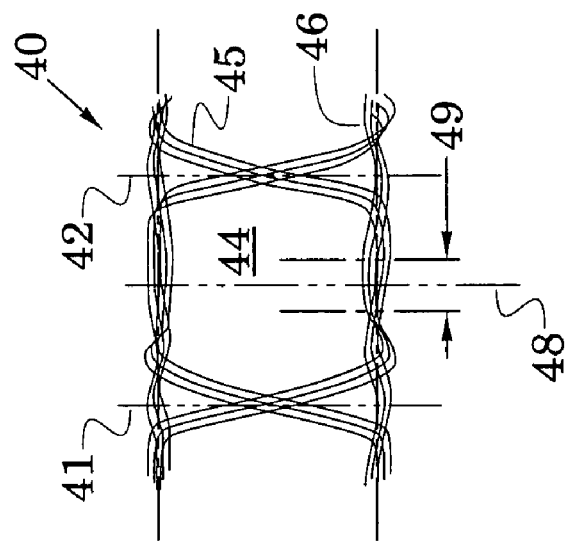
FIG. 2 is a sketch of a data eye which illustrates a useful application of a data clock from the clock processor of FIG. 1.

An exemplary use of the data clock $CLK_{data}$ can be examined with reference to a data eye 40 that is shown in FIG. 2. The data eye is a useful timing tool which can be formed with three successive clock periods. In particular, FIG. 2 shows period boundaries 41 and 42 between a middle clock period and preceding and succeeding clock periods. Data patterns (e.g., 1, 0, 0 and 0, 1, 1) are successively repeated to position a large number of falling and rising clock edges at the first boundary 41 and other data patterns (e.g., 0, 0, 1 and 1, 1, 0) are successively repeated to position a large number of falling and rising clock edges at the second boundary 42 (for illustrative clarity, only a few patterns are shown in FIG. 2).

These data patterns define a data eye 44 whose width is reduced because of clock jitter 45 (indicated by the horizontal extent of multiple data patterns) and whose height is reduced because of noise 46 on voltage supplies (indicated by the vertical extent of multiple data patterns). The reduced data eye 44 indicates the restrictions that must be overcome if the output digital code is to be successfully captured.

A receiver which is receiving a signal converter's high-speed output digital code generally needs an assertion edge which indicates a time at which the data of the digital code can be most reliably captured. Therefore, the assertion edge should be positioned well within the open region 44 of the data eye. The vertical line 48 in FIG. 2 indicates an exemplary assertion edge.

Receivers generally have a setup time which is the time during which data must be stable prior to the assertion edge to thereby assure successful acquisition of the data. Similarly, receivers generally have a hold time during which the data must be stable after the assertion edge to assure successful acquisition. The setup and hold times establish an acquisition window 49 about the assertion edge 48 during which the data must be stable (i.e., within the data eye 44) so that it can be reliably captured.

In FIG. 1, the data clock $CLK_{data}$ is shown to be delayed by 90 degrees from the system clock $CLK_{system}$ so that it is at the assertion edge 48 in the data eye of FIG. 2. As described above, the data clock thereby provides a temporal reference to aid in capturing data in a high-speed data stream (e.g., from a pipelined signal converter). Various considerations in actual applications may dictate, however, that an edge of the data clock should be offset from the center of the data eye. For example, attention to the setup time may be of particular importance so that the data clock edge may be preferably delayed from the center of the data eye to insure that adequate setup time is provided.

In an important feature of the clock processor embodiment 20 of FIG. 1, it is recognized that the stabilizer 22 generates the error signal 30 as it maintains the selected duty cycle of the system clock $CLK_{system}$ and that this error signal is available for other uses. The aligner 24 is therefore configured to also employ the error signal 30 in its generation of the data clock $CLK_{data}$. This shared use of the error signal 30 substantially simplifies the aligner 24 and reduces the complexity and cost of the clock processor 20.

Figure 3:
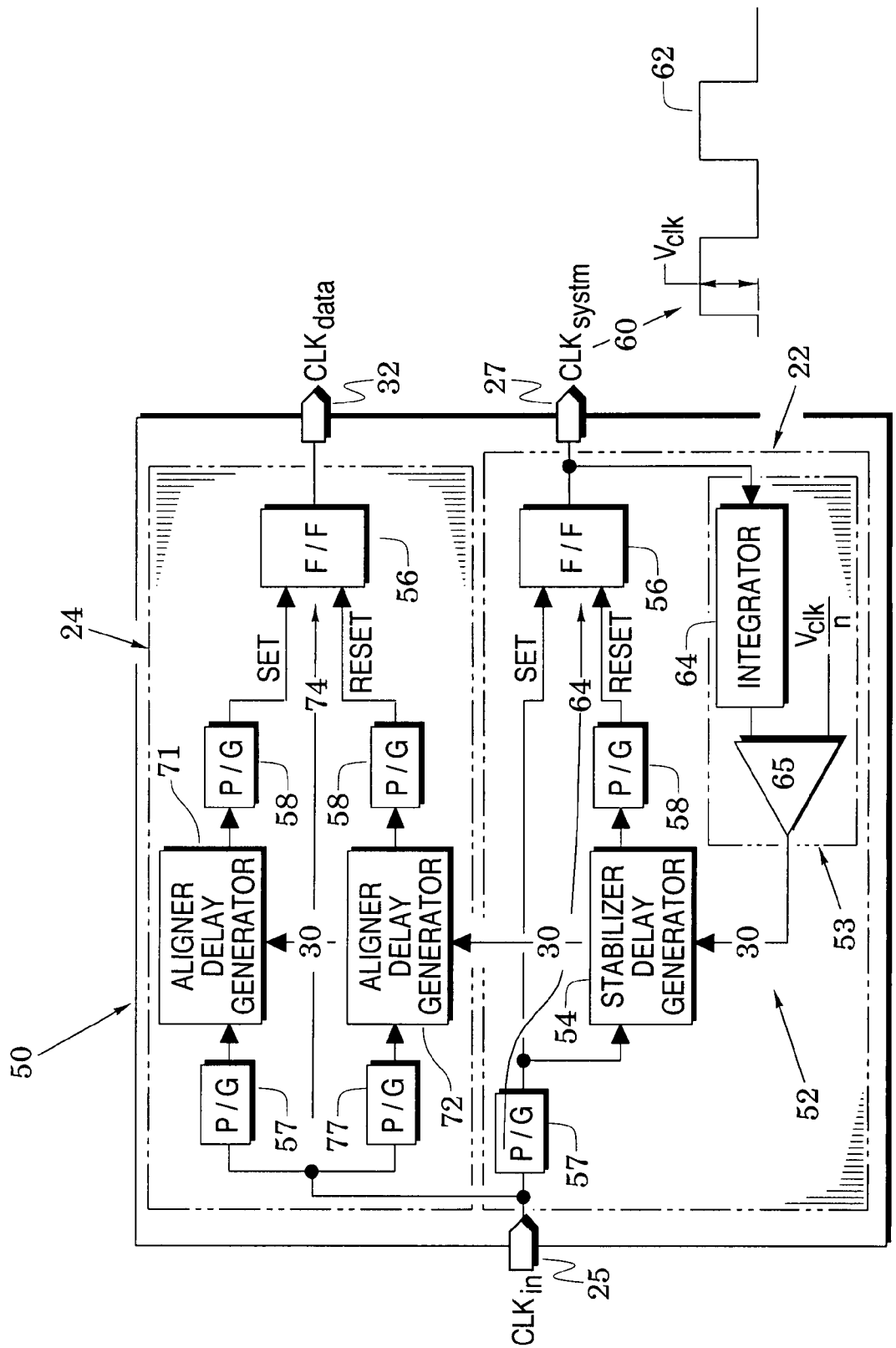
FIG. 3 is a block diagram which illustrates another embodiment of the clock processor of FIG. 1.

This shared use of the error signal 30 is further illustrated in the clock processor embodiment 50 that is shown in FIG. 3. The processor 50 includes elements of the processor 20 of FIG. 1 with like elements indicated by like reference numbers. In particular, the stabilizer 22 of FIG. 3 forms a delay-locked control loop 52 with a comparator network 53 and a stabilizer delay generator 54.

A bistable multivibrator in the form of a flip-flop (F/F) 56 delivers the system clock at the system port 27 and the comparator network 53 generates the error signal 30 to represent the difference between the average level of the system clock and a reference level. The time delay of the stabilizer delay generator 54 is controlled by the error signal 30 and this time delay determines the time that a reset signal is applied to the flip-flop 56.

In operation of the stabilizer 22 of FIG. 3, a pulse generator 57 generates a narrow pulse in response to a rising edge of the input clock at the input port 25 and this pulse forms a set input to the flip-flop 56. In response, the flip-flop initiates the first system portion 26 of each system cycle of the system clock as shown in FIG. 1. This set signal is also provided to the stabilizer delay generator 54 which responds by generating a reset signal after a stabilizer time delay that corresponds to the error signal 30.

The reset signal causes the flip-flop 56 to initiate the second system portion 28 shown in FIG. 1. That is, the second system portion 28 of each cycle of the system clock is delayed from the first system portion 26 by the delay of the stabilizer delay generator 54 and that delay is controlled by the error signal 30 from the comparator network 53. A second pulse generator 58 is preferably inserted after the delay generator to provide the reset signal to the flip-flop 56 as a narrow pulse.

In the processor embodiment of FIG. 3, the comparator network 53 is formed with an integrator 64 that provides an average level of the system clock at the system port 27. A comparator 65 then generates the error signal 30 in accordance to the difference between this average level and a reference level.

For example, an arrow 60 in FIG. 3 indicates an exemplary system clock 62 at the system port 27. The system clock is shown to have an amplitude $V_{clk}$ and the reference level at the comparator 65 is given by $V_{clk}/n$ wherein n is a number. In a processor embodiment in which n is 2, the control loop 52 will position the reset signal at the flip-flop 56 so that the average level of the system clock at the system port 27 is $V_{clk}/2$. In other words, the system clock will be controlled to have a 50 percent duty cycle. Other controlled duty cycles can be obtained by changing n in the reference level $V_{clk}/n$.

The stabilizer delay generator 54 provides a time delay whose magnitude is related to the magnitude (e.g., current or voltage) of the error signal 30 and this relationship defines a stabilizer sensitivity to the error signal 30. With a selected stabilizer sensitivity to the error signal 30, the comparator network 53 will adjust the value of the error signal to cause the average level of the system clock to substantially equal the reference level. If the reference level is $V_{clk}/2$, for example, the error signal 30 and the stabilizer sensitivity of the stabilizer delay generator 54 will be such as to cause the delay path 64 in the stabilizer 22 to provide a phase shift of 180 degrees (in terms of the system clock's period).

Clock processor embodiments are provided to apply the same error signal 30 to first and second aligner delay generators 71 and 72 in FIG. 3 which are configured to have an aligner sensitivity to the error signal 30 that may differ from the stabilizer sensitivity. The aligner sensitivity can thus be adjusted to provide any desired phase shift in the aligner delay generators relative to the phase shift of the stabilizer delay generator 54.

If, for example, the error signal 30 and the stabilizer sensitivity of the stabilizer delay generator 54 causes the delay path 64 in the stabilizer to have a phase shift of 180 degrees, then the phase shift along a delay path 74 in the aligner will have a phase shift of substantially 90 degrees if the aligner sensitivity is one half of the stabilizer sensitivity. If the aligner is arranged to process the input clock (as shown in FIG. 3), the data clock will be delayed by 90 degrees from the input clock.

If, instead, the aligner is arranged to process the input clock (as shown by the signal path 35 in FIG. 1), the data clock will be delayed by 90 degrees from the system clock. Other phase shifts can be obtained by simply varying the aligner sensitivity of the aligner delay generators 71 and 72 to the error signal 30. This is useful for varying the location of the assertion edge 48 in the data eye of FIG. 2.

The aligner 24 of FIG. 3 is completed by duplicating the pulse generators 57 and 58 and the flip-flop 56 in the stabilizer 22 and arranging them as shown in the aligner portion of the clock processor 50. Because the first and second aligner delay generators 71 and 72 are to be triggered on first and second portions of each cycle of the input clock, however, there needs to be an additional inversion process in one of the input pulse generators of the aligner 24. Accordingly, the reset signal for the aligner delay generator 72 is obtained with an initial pulse generator 77 that responds to a different clock edge than does the initial pulse generator 57 which precedes the aligner delay generator 71.

Having described a detailed embodiment of the clock processor 20 of FIG. 1, it can now be appreciated that the positioning of the edges of the system and data clocks is substantially independent of disturbing effects such as temperature and clock rate. This follows because the control loop 52 in FIG. 3 insures that the second system portion of each period of the system clock is constantly controlled by the error signal 30 to maintain the desired duty cycle and the aligner delays in the aligner 24 are similarly controlled because they share the same error signal. This is a significant advantage over conventional clock controls whose accuracy generally degrades in response to disturbing effects such as those mentioned above.

Figure 4:
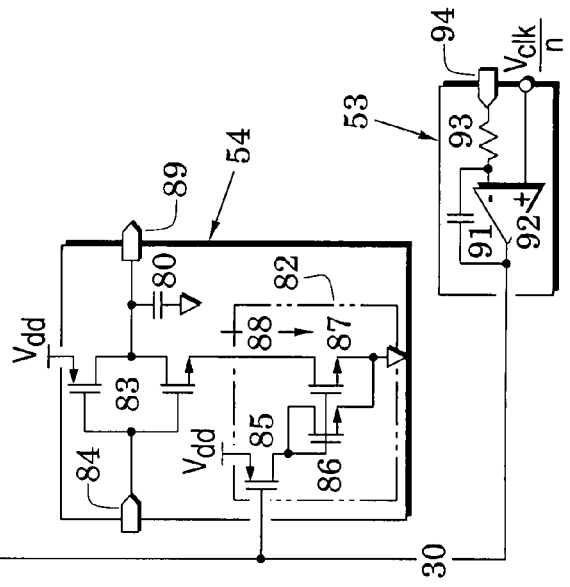
FIG. 4 is a schematic of embodiments of a comparator network and stabilizer and aligner delay generators in the clock processor of FIG. 3.

FIG. 4 illustrates detailed embodiments of the stabilizer delay generator 54 and the comparator network 53 of FIG. 3. The stabilizer delay generator includes a stabilizer capacitor 80, a stabilizer current mirror 82 that responds to the error signal 30, and an inverter 83 that couples the stabilizer current mirror to the stabilizer capacitor in response to the input clock at an input port 84. The inverter is formed with drain-coupled transistors of opposite polarity. The current mirror includes a current source transistor 85 that responds to the error signal 30 and supplies current to a diode-coupled transistor 86 which is gate-coupled to a mirror transistor 87 that provides a current 88 to the inverter 83.

When the input clock at the input port 25 of FIG. 3 transitions low, the pulse generator 57 of FIG. 3 delivers a short negative pulse to the inverter 83 in FIG. 4. The leading edge of this pulse quickly resets the voltage across the capacitor 80 to approximately $V_{dd}$ and the second edge initiates a flow of the current 88 out of the capacitor 80. When the voltage across the capacitor and at a generator output port 89 drops below a threshold in the pulse generator 58 of FIG. 3, this generator will provide the reset signal to the flip-flop 56. It is apparent, therefore, that the stabilizer delay generator in FIG. 4 has a stabilizer sensitivity to the error signal 30 that is controlled by the magnitude of the current 88 (i.e., size of the current mirror 82) and the size of the capacitor 89 (in an integrated circuit realization, this capacitor may be realized with a plurality of unit capacitors).

FIG. 4 also shows an embodiment of the comparator network 53 in which a capacitor 91 is coupled across a differential amplifier 92 and a resistor 93 is coupled between the capacitor 91 and an input port 94. The reference level $V_{Clk}/n$ shown in FIG. 3 is applied to the other input of the differential amplifier 92. In operation, the capacitor and resistor integrate the system clock (see FIG. 3) and the error signal 30 varies so as to vary the current 88 that is pulled from the capacitor 80 in the stabilizer delay generator 54.

FIG. 4 further illustrates an embodiment of the aligner delay generators 71 and 72. As shown, these generators are identical to the stabilizer delay generator 54 except that they are altered so that they have a desired aligner sensitivity which will generally differ from the stabilizer sensitivity of the stabilizer delay generator 54. For example, the capacitor 80 of the stabilizer delay generator can be altered to a smaller capacitor 96 so that the aligner delay generators 71 and 72 in FIG. 4 have an aligner sensitivity that is greater than the stabilizer sensitivity of the stabilizer delay generator. In a different embodiment, the current mirror 82 in the aligner delay generators 71 and 72 can be altered so that its current 88 is greater than the corresponding current in the aligner delay generator (and, hence, the aligner sensitivity will be greater than the stabilizer sensitivity of the stabilizer delay generator.

Figure 5:
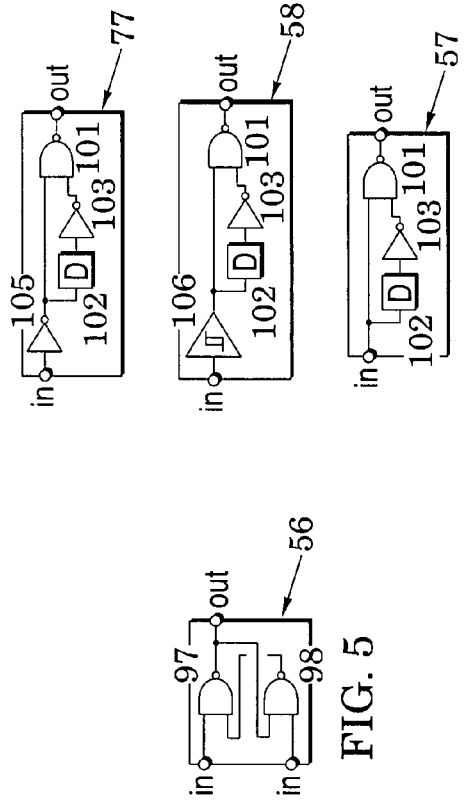
FIG. 5 is a schematic of an embodiment of a flip-flop in the clock processor of FIG. 3.
Figure 6:
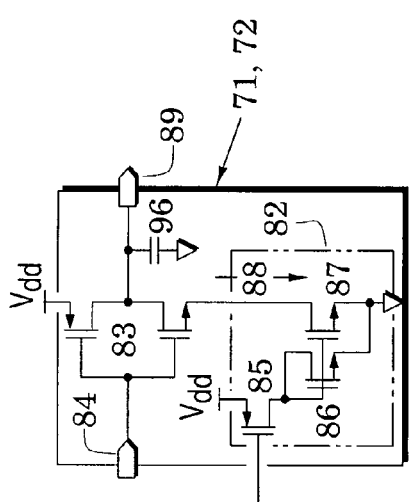
FIG. 6 illustrates schematics of embodiments of pulse generators in the clock processor of FIG. 3.

FIG. 5 illustrates an embodiment of the flip-flops 56 of FIG. 3 which is formed with cross-coupled NAND gates 97 and 98. FIG. 6 illustrates an embodiment of the pulse generators 57 of FIG. 3 in which one input terminal of a NAND gate 101 receives an input signal and the other input terminal receives the input signal after it passes through a delay 102 and an inverter 103. The pulse generators 57 thus provide a narrow negative pulse in response to a rising edge of the input clock of FIG. 3 but do not respond to the falling edge.

As mentioned above, it is desired that the pulse generator 77 of FIG. 3 respond to a different edge of the input clock. Accordingly, the embodiment of the pulse generator 77 that is shown in FIG. 6 is identical to the pulse generator 57 except an inverter 105 is inserted at its input.

As also mentioned above, the pulse generators 58 of FIG. 3 should respond when the signal out of the delay generators falls below a predetermined threshold. Accordingly, FIG. 6 illustrates an embodiment of the pulse generators 58 which is identical to the pulse generator 57 except that a comparator circuit 106 is inserted at its input. The comparator circuit 106 preferably includes positive feedback so that it rapidly switches when an input signal crosses its threshold. Such comparators exhibit a hysteresis action and are typically called Schmitt triggers. Such triggers are particularly useful for delivering a digital signal which is indicative of the level of an analog input signal relative to a threshold level.

Figure 7:
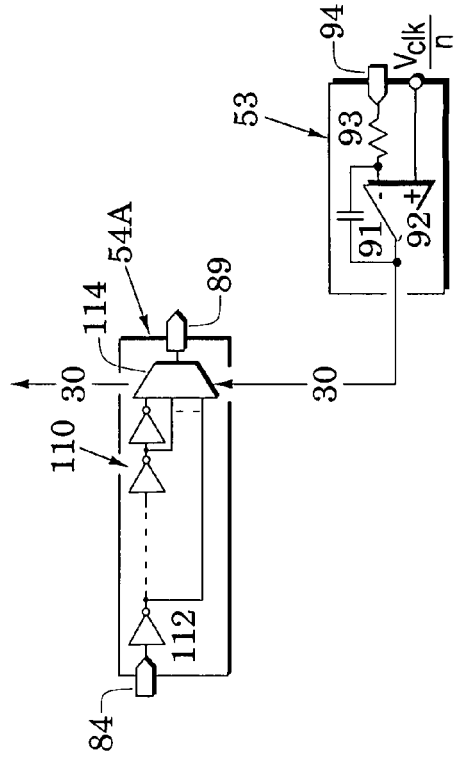
FIG. 7 is a schematic of other embodiments of a comparator network and a stabilizer delay generator in the clock processor of FIG. 3.

Although FIG. 4 illustrates an embodiment 54 of the stabilizer delay generator 54 of FIG. 3, clock processors may be realized with various other embodiments. For example, FIG. 7 illustrates a stabilizer delay generator 54A that receives an error signal 30 from the comparator network 53 that was first shown in FIG. 4. The generator 54A includes a string 110 of inverters 112 and also includes a multiplexer 114. The string 110 originates at a generator input port 84 and the outputs of various ones of the inverters are coupled as inputs to the multiplexer which, in turn, feeds a generator output port 89. The error signal 30 is structured (e.g., as a digital signal) to cause the multiplexer 114 to couple any selected one of the inverter outputs to the generator output port 89. Thus, the embodiment 54A can vary the time delay between input and output ports 84 and 89 in response to the error signal 30.

FIG. 7 shows that the error signal 30 extends upward from the stabilizer delay generator 54 to indicate that it can be coupled to similar aligner delay generators just as shown in FIG. 4. Although these generators are not shown in FIG. 7, they would generally be structured similarly to the stabilizer delay generator 54A but with an aligner sensitivity that differs from the stabilizer sensitivity. This can be realized, for example, by structuring the inverters 112 to have delays reduced from those in the stabilizer delay generator. Alternatively, generator aligner sensitivities can be realized by reducing the number of inverters between tap points that lead to the multiplexer 114.

Clock processor embodiments can also be used in systems which employ a delay-locked loop (DLL) or a phase-locked loop (PLL) for unrelated generation of other system clocks. For example, FIG. 8A includes a data clock aligner 124 which is similar to the aligner 24 of FIG. 3 except that the pulse generators 57, 58 and 77 have been incorporated within the aligner delay generators so that their reference numbers have been respectively changed from 71 and 72 to 121 and 122. The flip-flop 56 of FIG. 3 is arranged between the pulse generators and an output port 126 and the input clock is received at an input port 125 (in addition, the names of the input signals to the flip-flop have been shortened to R and S).

Figures 8A, 8B:
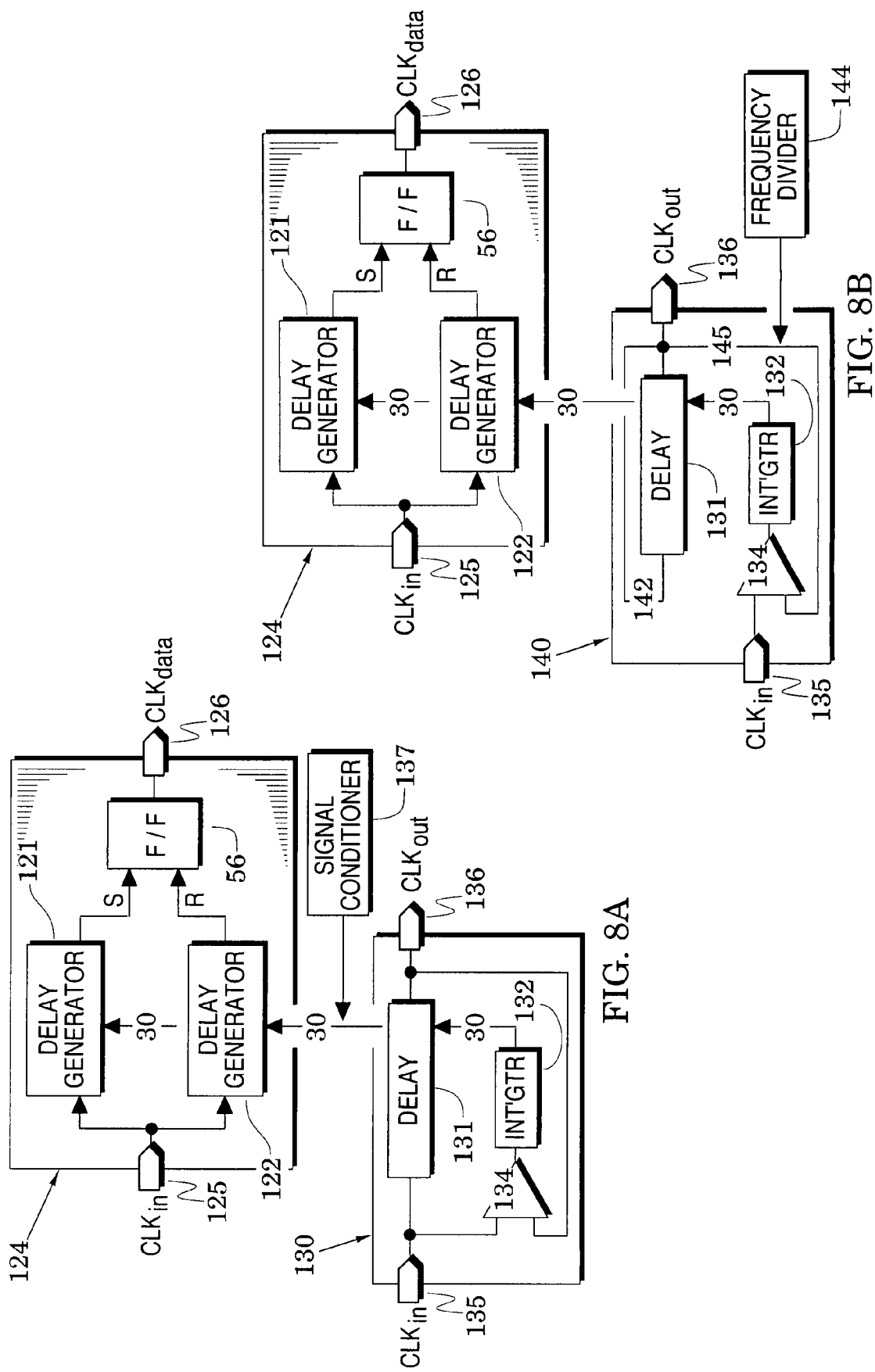
FIGS. 8A and 8B are block diagrams of clock processors in respective association with a system delay-locked loop and a system phase-locked loop.

FIG. 8A also illustrates a control loop in the form of a DLL 130 that is configured with a programmable delay network 131, an integrator (INT'GTR) 132, and a phase detector 134 which are arranged between input and output ports 135 and 136. The delay network 131 is coupled between the input and output ports and is configured (e.g., with a string of selectable inverters) so that it inserts a clock delay that is a function of the error signal 30.

The detector 134 is coupled to provide a signal that indicates the phase difference between the input clock $CLK_{in}$ and the output clock $CLK_{out}$ and the integrator 132 (e.g., a low pass filter) converts this phase difference into the error signal 30 which maintains the delay through the delay network 131 at a value that controls the output clock to have a desired phase relationship to the input clock. Accordingly, the error signal 30 has a known relationship to the phase difference between the input and output clocks and to the delay sensitivity of the delay network 131.

It is generally desired to set the delay through the delay generators 121 and 122 of the aligner 124 so that the data clock $CLK_{data}$ has a desired phase relationship to the input clock $CLK_{in}$ at the input port 125. If the delay generators 121 and 122 are configured to respond to the same type of error signal as the delay network 131, then their aligner sensitivity to the error signal 30 is adjusted so that their delay has a predetermined relationship to the delay in the delay network 131.

If the data clock is to have a 90 degree delay from the input clock, for example, and the output clock of the DLL 130 has a delay of X degrees, then the aligner sensitivity is set to be 90/X of the sensitivity of the delay network 131. If the delay generators 121 and 122 have a different structure from that of the delay network 131, a signal conditioner 137 may be inserted as shown in FIG. 8A to convert the form of the error signal 30 to a form compatible with the delay generators 121 and 122.

FIG. 8B replaces the DLL 130 of FIG. 8A with a control loop in the form of a PLL 140 which has elements of the DLL with like elements indicated by like reference numbers. In the PLL, the delay network 131 is configured with a feedback path 142 so that it forms an oscillator which provides the output clock $CLK_{out}$ in response to an error signal 30 from the integrator 132. In contrast to the DLL of FIG. 8A, the input clock continues to be one input of the detector 134 but not an input of the delay network 131.

The PLL 140 establishes a specific phase difference between the output and input clocks (e.g., a 90 degree difference) that is sufficient to generate an error signal 30 which will keep the frequency of the oscillator equal to the frequency of the input clock. The error signal 30, therefore, maintains that specific phase difference. Since there will be a known relationship between that phase difference and the desired phase difference in the aligner 124 (e.g., 90 degrees), the aligner sensitivity to the error signal 30 can be selected to obtain the data clock at the aligner's output port 126.

In other embodiments of the PLL 140, a frequency divider 144 may be inserted into the path 145 from the output clock to the detector 134 as shown in FIG. 8B. The phase relationship at the input to the detector 134 will be substantially unchanged but the frequency of the output clock will be multiplied by the inverse of the division of the frequency divider 144. In yet other embodiments of the PLL 140, the oscillator formed by the delay network 131 and feedback path 142 can be replaced by other types of oscillators (e.g., those formed with feedback about a resonant circuit such as an LC resonant circuit).

The clock processor embodiments of FIGS. 8A and 8B are useful in signal conditioning systems (e.g., pipelined signal converters) where a DLL or a PLL is required as part of the system structure. Even though they may be required for a function unrelated to that of a data clock aligner, they provide an error signal which can be used in manners similar to those described in FIGS. 1-7.

The clock processor embodiments of FIGS. 1-8B have significant utility in high-speed signal converter systems. Exemplary systems are pipelined, two-step and sigma-delta systems that operate with capacitors which are switched in system modes. For example, an embodiment 160 of a switched-capacitor converter system is shown in FIG. 9. This system includes a sampler 164, an initial converter stage 166 and at least one succeeding converter stage 168. The system 160 converts an analog input signal $S_{in}$ at an input port 161 to a corresponding digital code $C_{dgtl}$. This conversion is accomplished by successive (i.e., pipelined) conversions in the successive converter stages.

In particular, the sampler 164 provides a sample signal $S_{smpl}$ in response to the input signal $S_{in}$ and a respective pulse of a system clock $CLK_{system}$ and the initial converter stage 166 processes this sample to provide respective digital bits $B_{dgtl}$. The initial stage is also configured to provide a residue signal $S_{res}$ to a succeeding converter stage.

In similar fashion, each successive converter stage 168 processes a preceding residue signal $S_{res}$ to provide respective digital bits $B_{dgtl}$ and provide a respective residue signal $S_{res}$ to a succeeding converter stage. However, a final stage 169 only provides respective digital codes $B_{dgtl}$ as it has no need to provide a residue signal. Because these conversions are effected on successive clock pulses, they must be temporally aligned in an alignment and correction logic 170.

The converter stages of the system are generally configured to provide extra digital bits so that the logic 170 can utilize them to eliminate conversion errors and generate the final digital code $C_{dgtl}$ that corresponds to the original sample. In other system embodiments, the sampler 164 may be eliminated and its function performed in the initial converter stage 106.

Converter stages other than the final stage 169 typically have an analog-to-digital converter (ADC) 172 (e.g., a flash ADC) that converts the sample signal $S_{smpl}$ to the respective digital bits $B_{dgtl}$. These stages also include an MDAC 174 that receives the sample signal $S_{smpl}$ (or residue signal $S_{res}$) and also receives a decision signal 176 from the ADC 172. The decision signal indicates which of all possible digital bits $B_{dgt}$ is being provided at any given clock cycle by the ADC 172. From these inputs, the MDAC generates a residue signal for further processing by subsequent stages.

FIGS. 10A and 10B show a switched-capacitor embodiment 180 of the MDACs 174 in the converter stages 166 and 168. The embodiment 180 includes sample and output capacitors 181 and 182, first and second switches 183 and 184 and a differential amplifier 185 that drives an output port 186. The sample capacitor 181 has an upstream plate that is coupled to an input port 187 and to the second switch 184 and has a downstream plate coupled to an inverting input of the differential amplifier 185. The output capacitor 182 is coupled about the differential amplifier 185. An output switch 188 is coupled to the output of the differential amplifier.

FIGS. 10A and 10B respectively show sample and gain operational modes in which switches are operated in φ1 and φ2 phases of each period of the system clock. Accordingly, FIG. 10A shows that the first switch 183 is closed in the φ1 phase so that an input signal passes along a signal path 190 and is received in the sample capacitor 181. During this sample mode, the output of the amplifier 185 is grounded via the output switch 188 so that there are no charges in the output capacitor 182. Charges from the sample signal $S_{smpl}$ are thus captured in the sample capacitor 181.

FIG. 10B shows that, in the φ2 phase, the first and output switches 183 and 188 are open and the second switch 184 is moved to respond to the decision signal (176 in FIG. 4) to thereby establish a signal path 191 that applies a selected one of reference voltages (e.g., top and bottom reference voltages $V_{reft}$ and $V_{refb}$) to the upper plate of the sample capacitor 181 to thereby move charges along the signal path 191. Charges are thus transferred from the sample capacitor to the output capacitor 182 to thereby generate the residue signal $S_{res}$ at the output port 186.

The sample and gain modes thus provide a signal gain given by a ratio of the sample and output capacitors. In addition, the resultant signal is shifted up or down by the decision signal 176 from the appropriate ADC 172. As shown in FIGS. 10A and 10B, the shift magnitudes are selected from $V_{reft}$ and $V_{refb}$ which differ by an input window $V_{ref}$ at the input port 161. The decision signal indicates the region within the input window in which the present input signal resides and controls amplification of that region so that the resultant residue signal can be passed to succeeding stages for further conversion.

In each clock cycle, some stages are in their sample operational modes and succeeding stages are in their gain operational modes. To insure conversion accuracy, it is important that the time duration of these two portions of each clock cycle be identical. If the second portion is reduced, for example, the charge transfer time along the signal path 191 in FIG. 10B will be alternately shortened and lengthened which will induce residue signal errors that cannot be corrected.

Accordingly, the converter system 160 includes the clock processor 20 shown in FIG. 1. The processor receives an input clock $CLK_{in}$ which may be supplied, for example, by a user of the system 160. Even though this clock may have a duty cycle that differs from 50 percent, the processor 20 will provide, to the converter stages, a system clock $CLK_{system}$ with a 50 percent duty cycle. In addition, the processor 20 will provide a data clock $CLK_{data}$ which can be used in a receiver to recover the data in the data stream of the digital code $C_{dgtl}$ because it has an assertion edge approximately positioned at the vertical line 48 in the data eye of FIG. 2.

In some cases, a user of the converter system 160 may wish to alter the position of the assertion edge to compensate, for example, for phase delays that are introduced by interconnections with other receiver elements. In an exemplary clock processor embodiment, these delays can be canceled by realizing the transistor 87 in the aligners 71, 72 of FIG. 4 with multiple transistors which permit altering of the magnitude of the current 88. The user can then command the number of transistors in use to thereby alter the aligner sensitivity to the control signal 30. The altered sensitivity changes the aligner's delay so as to bring the assertion edge of the data clock into the desired position in the data eye of FIG. 2.

It is noted that the switched-capacitor converter stages of the signal converter 160 of FIG. 10 are often realized in differential form and their differential signals operate about a common-mode level. In such converters, the common-mode level may be the same as the level reference $V_{clk}/n$ shown in the comparator network 53 of FIG. 3.

Clock processors have been described in which a duty cycle stabilizer control loop constantly controls an error signal to maintain a desired duty cycle in a system clock and a data clock aligner employs the same error signal to maintain a desired delay from either the system clock or an input clock. In these processors, the aligner has an aligner sensitivity to the error signal that has a predetermined relationship to the stabilizer sensitivity. As the input clock rate is altered, the control loop alters the error signal to maintain the desired duty cycle. To a high degree of accuracy, this altered error signal will also control the aligner to maintain the desired delay.

It is recognized, however, that there are elements (e.g., pulse generator gate delays) in the aligner delay path (74 in FIG. 3) whose delay is fixed and thus not a function of the error signal. In addition, there are parasitic capacitances (e.g., parasitic input capacitance in the aligner pulse generators 58) that may introduce error into aligner delay generator embodiments such as that shown in FIG. 4 because they disturb the intended relationship between stabilizer and aligner capacitances. Although effects such as these will disturb the control of clock delays in the aligner, they are generally minor and can be compensated if they become significant in extreme operational modes. Simulations conducted at clock rates of 40, 125 and 150 megasamples per second have shown acceptably stable delays of the data clock over typical performance corners.

The embodiments of the invention described herein are exemplary and numerous modifications, variations and rearrangements can be readily envisioned to achieve substantially equivalent results, all of which are intended to be embraced within the spirit and scope of the invention as defined in the appended claims.

We claim:

1. A clock processor for processing an input clock of a system, comprising:
   a duty cycle stabilizer configured to respond to said input clock to initiate a first system portion of each system cycle of a system clock and to include a control loop to provide an error signal that controls a second system portion of said system cycle to thereby maintain a selected duty cycle of said system clock; and
   a data clock aligner configured to respond to said error signal and provide a data clock that is delayed by a selected delay from said system clock.

2. The processor of claim 1, wherein said selected duty cycle is substantially 50 percent.

3. The processor of claim 1, wherein said selected delay is substantially 90 degrees.

4. The processor of claim 1, wherein said aligner is arranged to process said input clock.

5. The processor of claim 1, wherein said aligner is arranged to process said system clock.

6. The processor of claim 1, wherein said control loop is a delay-locked loop.

7. The processor of claim 6, wherein said delay-locked loop includes a delay generator formed with a current mirror and a capacitor coupled to receive a current from said current mirror.

8. The processor of claim 6, wherein said delay-locked loop includes a delay generator formed with a string of multiplexed delay elements.

9. A clock processor for processing an input clock of a system, comprising:
a duty cycle stabilizer configured to respond to said input clock to initiate a first system portion of each system cycle of a system clock and to include a control loop to provide an error signal that controls a second system portion of said system cycle to thereby maintain a selected duty cycle of said system clock; and
a data clock aligner configured to respond to said error signal and provide a data clock that is delayed by a selected delay from said system clock;
wherein:
said control loop includes a stabilizer delay generator configured with a stabilizer sensitivity to said error signal such that said second system portion is initiated after a selected stabilizer time delay; and
said aligner includes first and second aligner delay generators arranged to respectively initiate first and second data portions of each data cycle of said data clock and each configured to have an aligner sensitivity to said error signal such that said first and second data portions are initiated after a selected aligner time delay.

10. The processor of claim 9, wherein said control loop further includes a comparator network that provides said error signal in accordance to the difference between an average level of said system clock and a reference level.

11. The processor of claim 9, wherein:
said stabilizer further includes:
first and second stabilizer pulse generators to respectively respond to said input clock and said stabilizer delay generator; and
a stabilizer flip-flop to provide said system clock in response to said first and second stabilizer pulse generators;
and said aligner further includes:
first aligner pulse generators and second aligner pulse generators that respectively respond to a selected one of said input and system clocks and to said aligner delay generators; and
an aligner flip-flop to provide said data clock in response to said second aligner pulse generators.

12. The processor of claim 9, wherein:
said stabilizer delay generator includes:
a stabilizer capacitor;
a stabilizer current mirror that responds to said error signal; and
an inverter that couples said stabilizer current mirror to said stabilizer capacitor in response to said input clock;
and each of said first and second aligner delay generators includes:
an aligner capacitor;
an aligner current mirror that responds to said error signal; and
an inverter that couples said aligner current mirror to said aligner capacitor in response to a selected one of said input and system clocks.

13. The processor of claim 12 wherein said aligner current mirror provides a current greater than that of said stabilizer current mirror.

14. The processor of claim 9, wherein:
said stabilizer delay generator includes:
a stabilizer delay line driven by said input clock and having a stabilizer string of delay elements; and
a multiplexer to select a portion of said stabilizer string in response to said error signal, and each of said first and second aligner delay generators includes:
an aligner delay line driven by said input clock and having an aligner string of delay elements; and
a multiplexer to select a portion of said aligner string in response to a said error signal.

15. A clock processor for processing an input clock of a system, comprising:
a control loop that includes a delay network and is configured to apply an error signal to said delay network for generation of an output clock in response to said input clock; and
a data clock aligner that includes first and second aligner delay generators arranged to respectively initiate first and second data portions of each data cycle of a data clock that is delayed by a selected delay from said system clock wherein said first and second aligner delay generators are each configured to have an aligner sensitivity to said error signal such that said first and second data portions are initiated after a selected aligner time delay.

16. The processor of claim 15, wherein said control loop is a delay-locked loop.

17. The processor of claim 15, wherein said control loop is a phase-locked loop.

18. A signal converter system for converting an analog input signal into a corresponding digital code in response to an input clock, the system comprising:
a pipelined arrangement of converter stages that successively process said input signals to corresponding digital bits in response to a system clock derived from said input clock;
an alignment/correction logic configured to process said digital bits into said digital code;
a duty cycle stabilizer configured to respond to said input clock to initiate a first system portion of each system cycle of said system clock and to include a control loop to provide an error signal that controls a second system portion of said system cycle to thereby maintain a selected duty cycle of said system clock;
a data clock aligner configured to respond to said error signal and provide a data clock that is delayed by a selected delay from said system clock wherein said data clock provides a temporal reference for said digital code;
wherein:
said control loop includes a stabilizer delay generator configured with a stabilizer sensitivity to said error signal such that said second system portion is initiated after a selected stabilizer time delay; and
said aligner includes first and second aligner delay generators arranged to respectively initiate first and second data portions of each data cycle of said data clock and each configured to have an aligner sensitivity to said error signal such that said first and second data portions are initiated after a selected aligner time delay.

19. The system of claim 18, wherein said control loop is a delay-locked loop that includes a delay generator formed with a current mirror and a capacitor arranged to receive a current from said current mirror.

20. The system of claim 18, wherein said control loop is a delay-locked loop that includes a delay generator formed with a string of delay elements.

* * * * *